United States Patent
Tanaka

(10) Patent No.: US 8,791,662 B2
(45) Date of Patent: Jul. 29, 2014

(54) POWER SEMICONDUCTOR MODULE, ELECTRIC-POWER CONVERSION APPARATUS, AND RAILWAY VEHICLE

(75) Inventor: Takeshi Tanaka, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 107 days.

(21) Appl. No.: 13/697,804

(22) PCT Filed: Jul. 1, 2010

(86) PCT No.: PCT/JP2010/061265
§ 371 (c)(1),
(2), (4) Date: Nov. 14, 2012

(87) PCT Pub. No.: WO2012/001805
PCT Pub. Date: Jan. 5, 2012

(65) Prior Publication Data
US 2013/0063067 A1    Mar. 14, 2013

(51) Int. Cl.
*H01L 25/07* (2006.01)
*H01L 25/18* (2006.01)

(52) U.S. Cl.
USPC ............................. 318/494; 363/123; 363/131

(58) Field of Classification Search
USPC ................... 318/494; 363/123, 124, 131–133
See application file for complete search history.

(56) References Cited

U.S. PATENT DOCUMENTS

| | | | | |
|---|---|---|---|---|
| 4,091,338 A | * | 5/1978 | Morihisa | 331/116 FE |
| 6,097,257 A | * | 8/2000 | Kadowaki et al. | 331/116 FE |
| 8,067,993 B2 | * | 11/2011 | Nasu | 331/116 FE |
| 2005/0151167 A1 | | 7/2005 | Onishi et al. | |
| 2006/0067059 A1 | | 3/2006 | Ushijima et al. | |
| 2009/0057929 A1 | | 3/2009 | Sasaki et al. | |
| 2011/0062491 A1 | | 3/2011 | Nakata | |

FOREIGN PATENT DOCUMENTS

| | | |
|---|---|---|
| JP | 61-40039 U | 3/1986 |
| JP | 01-321723 A | 12/1989 |
| JP | H08336239 A | 12/1996 |
| JP | 2000-232771 A | 8/2000 |
| JP | 2003-31765 A | 1/2003 |
| JP | 2005-198443 A | 7/2005 |
| JP | 2006-100327 A | 4/2006 |
| JP | 2007-234722 A | 9/2007 |
| JP | 2009-59923 A | 3/2009 |
| JP | 2009-147062 A | 7/2009 |
| WO | 2010/004802 A1 | 1/2010 |

OTHER PUBLICATIONS

Japanese Office Action (Notice of Rejection) dated Feb. 19, 2013, issued in corresponding Japanese Patent Application No. 2011-242453, and Partial English language translation of Office Action. (4 pages).

(Continued)

*Primary Examiner* — Bentsu Ro
(74) *Attorney, Agent, or Firm* — Buchanan Ingersoll & Rooney PC

(57) ABSTRACT

A pair of elements that includes a Si-MOSFET and a Si-FWD connected in inverse parallel and operates as a positive side arm of an electric-power conversion apparatus and a pair of elements that operates as a negative side arm of the electric-power conversion apparatus are provided, where the first and second pairs of elements are accommodated in one power semiconductor module to compose a 2-in-1 module, and terminals are included which enables series connection of the pairs of elements.

4 Claims, 14 Drawing Sheets

(56) References Cited

OTHER PUBLICATIONS

International Search Report (PCT/ISA/210) issued on Aug. 31, 2010, by the Japanese Patent Office as the International Searching Authority for International Application No. PCT/JP2010/061265.

Written Opinion (PCT/ISA/237) issued on Aug. 31, 2010, by the Japanese Patent Office as the International Searching Authority for International Application No. PCT/JP2010/061265.

English Translation of Notice of Rejection issued in corresponding Japanese application No. 2011-526741.

English Translation of Decision of Patent Grant Issued in corresponding Japanese application No. 2011-526741.

Extended European Search Report dated Jan. 31, 2014, issued by European Patent Office in corresponding European Patent Application No. 10854102.0 (7 pgs).

* cited by examiner (a)

(b)

POWER SEMICONDUCTOR MODULE, ELECTRIC-POWER CONVERSION APPARATUS, AND RAILWAY VEHICLE

FIELD

The present invention relates to an electric-power conversion apparatus that can be applied to a power device machine, and more particularly to a power semiconductor module that can be mounted on such a type of electric-power conversion apparatus.

BACKGROUND

In recent years, usage of a power semiconductor module covers various types and broad range of power devices or apparatuses such as from a home electronic appliance to a railway vehicle, an electric vehicle, an industrial robot, and a power conditioner. With an increase of the usability of the power semiconductor module, its performance enhancement is expected, and characteristics of high frequency, size reduction, and high power are increasingly desired.

On the other hand, with an achievement of high withstand voltage of an IGBT (Insulated Gate Bipolar Transistor) as a switching element, a high withstand-voltage IGBT having a rated voltage equivalent to that of a thyristor is commercially available. The IGBT is capable of operating at a high speed and obtaining a high withstand voltage and a large current capacity in a relatively simple manner, further having an advantage that an input resistance is high and a voltage control can be performed in a simple manner. Therefore, in an application with a high voltage input, such as a railway vehicle, an electric vehicle, and a power conditioner, there are a considerable number of cases where the IGBT is used as a switching element in a power semiconductor module. In practice, there exists a wealth of lineups of power semiconductor modules having the high withstand-voltage capability in which the IGBT is incorporated. As the power semiconductor module of the high withstand-voltage capability in which the IGBT is incorporated, a configuration disclosed in the following Patent Literature 1 has been known, for example.

CITATION LIST

Patent Literature

Patent Literature 1: Japanese Patent Application Laid-open No. 2009-147062

SUMMARY

Technical Problem

However, one of the important issues in driving multiple switching elements connected in series is to equalize element voltages respectively applied to the switching elements. Particularly, when a switching element is turned off, it is pointed out that a surge voltage generated by a main circuit inductance (L) and a change ratio of a collector current (di/dt) may cause that a voltage over a rated voltage is applied to a specific switching element, which may cause an element breakdown. Although it has been mentioned that there exist the wealth of lineups of power semiconductor modules of the high withstand-voltage capability in which the IGBT is incorporated, this means a difficulty in driving the IGBTs connected in series. That is, in the conventional techniques, as it is difficult to drive the IGBTs connected in series, it is necessary to have the wealth of lineups.

For this reason, in a power semiconductor module of a high withstand-voltage capability in which the IGBT is incorporated in a conventional railway application, for example, developments have to be made respectively for a power semiconductor module having a withstand voltage of 1.7 kilovolts for an overhead wire of 750 volts, a power semiconductor module having a withstand voltage of 3.3 kilovolts for an overhead wire of 1500 volts, and a power semiconductor module having a withstand voltage of 6.5 kilovolts for an overhead wire of 3000 volts. In addition, depending on a specification of the railway vehicle, a power semiconductor module having a withstand voltage of 2.5 kilovolts or 4.5 kilovolts, which is also one of the reasons for having the wealth of lineups.

Furthermore, the power semiconductor module of the high withstand-voltage capability is also necessary even in an application such as an electric vehicle or a power conditioner. Therefore, in the power semiconductor module of the high withstand-voltage capability in which the IGBT is incorporated, a wide variety of kinds are necessary and each kind is manufactured in small quantities, thus there exists a problem that it is difficult to reduce the cost, because of failing to obtain a mass production effect.

The present invention has been done in view of the above problems, and an object of the present invention is to provide a power semiconductor module of a high withstand-voltage capability having general versatility and capable of achieving a mass production effect.

Another object of the present invention is to provide an electric-power conversion apparatus including the power semiconductor module described above and a railway vehicle including the electric-power conversion apparatus.

Solution to Problem

There is provided a power semiconductor module according to an aspect of the present invention including: a first pair of elements that includes a diode element and a MOS switching element connected in inverse parallel; and a second pair of elements that includes a diode element and a MOS switching element connected in inverse parallel, wherein the first and second pairs of elements are accommodated in one module to compose a 2-in-1 module, and the power semiconductor module further includes external electrode terminals that enable connection of the first and second pairs of elements; a resistor being connected between a gate terminal and a source terminal of a MOS switching element composing each of the pair of elements; a series circuit of an overvoltage clamping element that clamps a gate-drain voltage of the MOS switching element to be equal to or lower than a withstand voltage of the MOS switching element and a unidirectional conducting element forward connected in a direction from a drain terminal to the gate terminal being connected between the gate terminal and the drain terminal of the MOS switching elements; a first voltage fixing element that fixes a gate potential of the MOS switching element of the second pair of elements to a potential of a direct-current power source of the MOS switching element being connected to a gate terminal of the MOS switching element of the second pair of elements; and a second voltage fixing element that fixes a drain potential of the MOS switching element to the potential of the direct-current power source being connected between the gate terminal and a drain terminal of the MOS switching element of the second pair of elements.

Advantageous Effects of Invention

According to the present invention, it is possible to provide a power semiconductor module of a high withstand-voltage capability having general versatility and capable of achieving a mass production effect.

DESCRIPTION OF EMBODIMENTS

Figure 1:
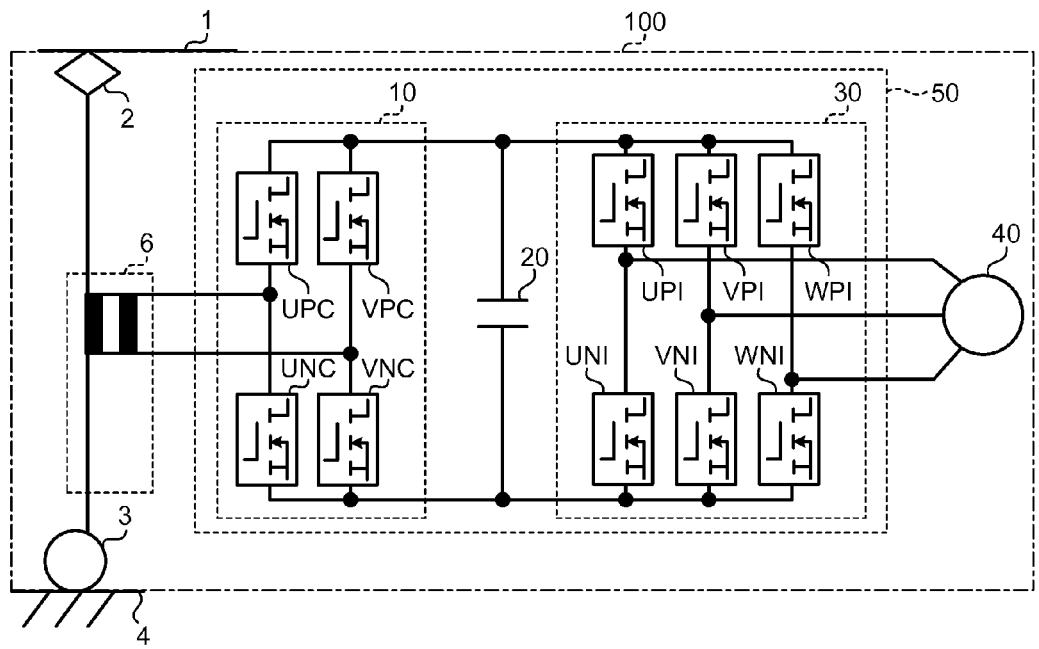
FIG. 1 depicts a schematic functional configuration of an electric-power conversion apparatus according to a first embodiment of the present invention.

First Embodiment an electric-power conversion apparatus according to a first embodiment of the present invention is explained first. FIG. 1 depicts a schematic functional configuration of the electric-power conversion apparatus according to a first embodiment of the present invention, which is an example of a configuration of an electric-power conversion apparatus 50 incorporated in a railway vehicle 100. As shown in FIG. 1, the electric-power conversion apparatus 50 is configured to include a converter 10, a capacitor 20, and an inverter 30. In the railway vehicle 100 further includes a transformer 6 that is located on an input terminal side of the electric-power conversion apparatus 50 and connected to the converter 10 and a motor 40 that drives the vehicle using a power supplied from the electric-power conversion apparatus 50. As the motor 40, an inductor motor or a synchronous motor is preferred.

An end of a primary winding of the transformer 6 is connected to an overhead wire 1 via a power collecting device 2, and another end is connected to a rail 4 having a ground potential via a wheel 3. The power supplied from the overhead wire 1 is inputted to the primary winding of the transformer 6 via the power collecting device 2, and a power generated on a secondary winding of the transformer 6 is inputted to the converter 10.

The converter 10 includes a circuit units in which a positive side arm composed of a switching element UPC or VPC (for example, UPC for a U-phase) and a negative side arm composed of a switching element UNC or VNC (for example, UNC for a U-phase) are connected in series (hereinafter, the circuit unit is referred to as "leg"). That is, in the converter 10, a single-phase bridge circuit is formed which includes two legs (a U-phase component and a V-phase component).

The converter 10 converts the input alternate-current voltage into a predetermined direct-current voltage by PWM controlling the switching elements UPC, VPC, UNC, and VNC and outputs the converted direct-current voltage.

To an output terminal of the converter 10, the capacitor 20 that serves as a direct-current power supply is connected in parallel, and the inverter 30 that receives a direct-current voltage of the capacitor 20 as an input, converts the input direct-current voltage into an alternate-current voltage having an arbitrary voltage and an arbitrary frequency, and outputs the converted alternate-current voltage is connected.

The inverter 30 includes legs in each of which a positive side arm composed of a switching element UPI, VPI, or WPI (for example, UPI for a U-phase) and a negative side arm composed of a switching element UNI, VNI, or WNI (for example, UNI for a U-phase) are connected in series. That is, in the inverter 30, a three-phase bridge circuit is formed which includes three legs (a U-phase component, a V-phase component, and a W-phase component).

The inverter 30 converts the input direct-current voltage into a predetermined alternate-current voltage by PWM controlling the switching elements UPI, VPI, WPI, UNI, VNI, and WNI and outputs the converted alternate-current voltage.

Although an example of a case where the electric-power conversion apparatus is applied to an electric vehicle having an alternate-current input is shown is shown in FIG. 1 as a preferred example of the electric-power conversion apparatus according to the first embodiment, it can be applied to an electric vehicle having a direct-current input in the same manner, which is frequently used in a subway or a suburban electric vehicle. Because a configuration of the electric vehicle having the direct-current input is publicly known, descriptions thereof will be omitted.

Figure 2:
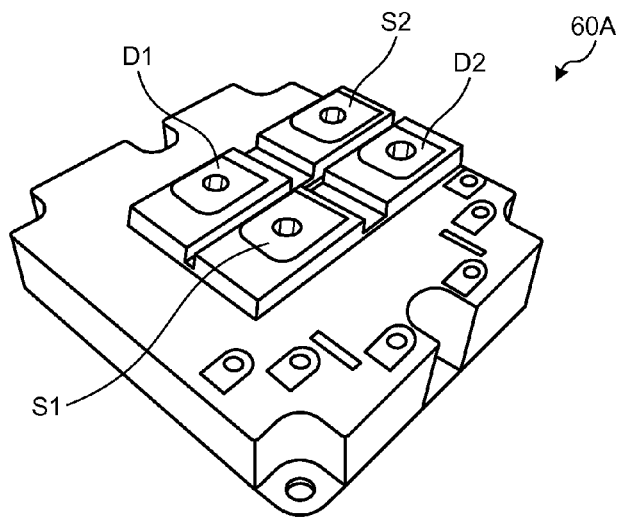
FIG. 2 is a perspective view of a schematic shape of a power semiconductor module according to the first embodiment.

A power semiconductor module used in the electric-power conversion apparatus according to the first embodiment is explained next. FIG. 2 is a perspective view of a schematic shape of the power semiconductor module according to the first embodiment, and FIG. 3 is a schematic diagram of a circuit configuration of the power semiconductor module shown in FIG. 2.

Figure 3:
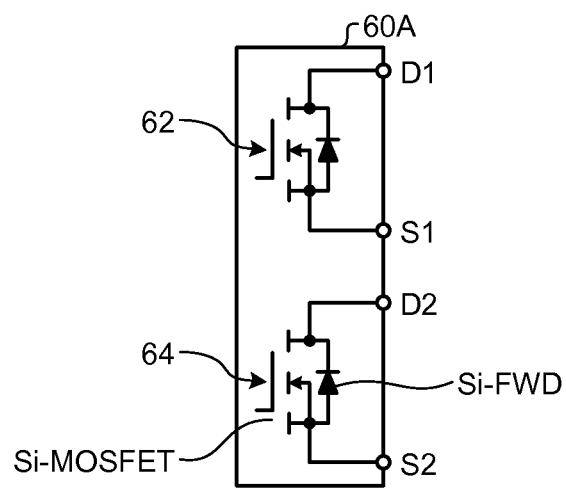
FIG. 3 is a schematic diagram of a circuit configuration of the power semiconductor module shown in FIG. 2.

As shown in FIGS. 2 and 3, a power semiconductor module 60A according to the first embodiment includes two pairs of elements including a first pair of elements 62 and a second pair of elements 64 accommodated in a package. In each of the first pair of elements 62 and the second pair of elements 64, for example, a silicon (Si)-based MOSFET (Si-MOSFET) and, for example, a Si-based FWD (Si-FWD (Fly Wheel Diode)) are connected in inverse parallel. In this manner, the power semiconductor module 60A according to the first embodiment is a so-called "2-in-1 module" in which two pairs of elements are accommodated in one module.

In the first pair of elements 62, a drain of the Si-MOSFET and a cathode of the Si-FWD are connected to each other in the module, from the connection node a lead is drawn and connected to a drain electrode D1 located on an upper surface of the power semiconductor module 60A, a source of the Si-MOSFET and an anode of the Si-FWD are connected to each other in the module, and from the connection node a lead is drawn and connected to a source electrode S1 located on the upper surface of the power semiconductor module 60A. In the same manner, in the second pair of elements 64, a drain of the Si-MOSFET and a cathode of the Si-FWD are connected to each other in the module, from the connection node a lead is drawn and connected to a drain electrode D2 located on the upper surface of the power semiconductor module 60A, a source of the Si-MOSFET and an anode of the Si-FWD are connected to each other in the module, and from the connection node a lead is drawn and connected to a source electrode S2 located on the upper surface of the power semiconductor module 60A.

As is clearly understood from the configuration shown in FIG. 2 and the circuit configuration shown in FIG. 3, it is possible to compose a circuit in which the first pair of elements 62 and the second pair of elements 64 are connected in series by electrically connecting the source electrode S1 and the drain electrode D2 or the drain electrode D1 and the source electrode S2 of the power semiconductor module 60A with a conductive bar or the like. Therefore, the power semiconductor module 60A shown in FIG. 2 is a power semiconductor module suitable for a usage mode in which a withstand voltage of an element (a module) is increased (hereinafter, "series application").

Figure 4:
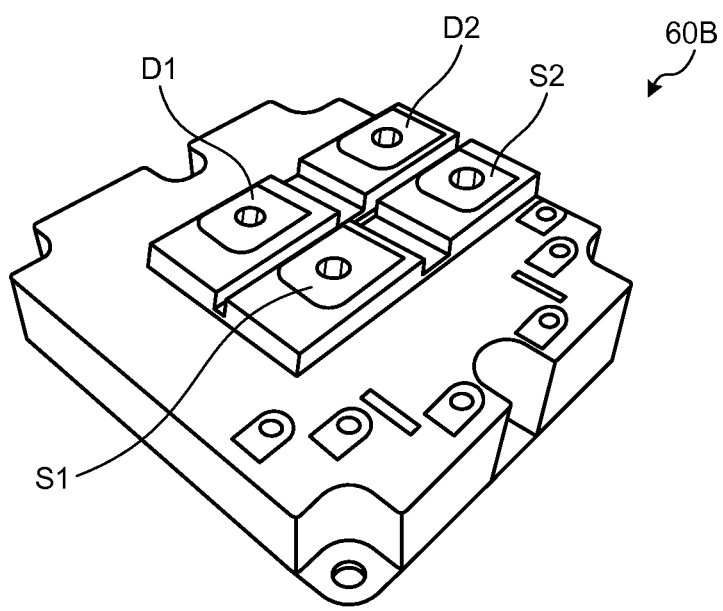
FIG. 4 is a perspective view of a schematic shape of a power semiconductor module, whose type is different from that shown in FIG. 2, according to the first embodiment.

FIG. 4 is a perspective view of a schematic shape of a power semiconductor module according to the first embodiment, which is of a type different from that shown in FIG. 2. A circuit configuration of a power semiconductor module 60B shown in FIG. 4 is the same as that shown in FIG. 3. In the power semiconductor module 60B shown in FIG. 4, an arrangement of electrodes located on the upper surface of the module is different from that shown in FIG. 2, and specifically, the arrangement of the drain electrode D2 and the source electrode S2 is reversed from that shown in FIG. 2. In FIG. 4, it is possible to compose a circuit in which the first pair of elements 62 and the second pair of elements 64 are connected in parallel by electrically connecting the drain electrode D1 and the drain electrode D2 and the source electrode S1 and the source electrode S2 of the power semiconductor module 60A, respectively, with conductive bars or the like. Therefore, the power semiconductor module 60B shown in FIG. 4 is a power semiconductor module suitable for a usage mode in which a current capacity is increased (hereinafter, "parallel application").

Figure 5:
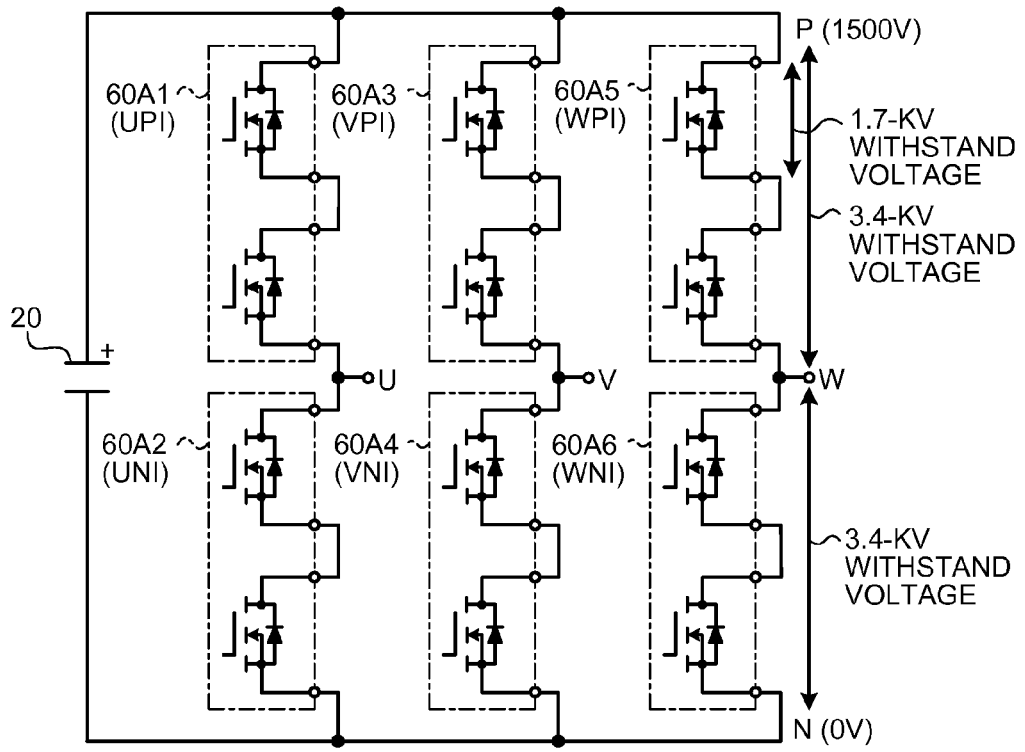
FIG. 5 is an example of a configuration of an inverter circuit composed of the power semiconductor module according to the first embodiment.

FIG. 5 is an example of a configuration of an inverter circuit composed of the power semiconductor module according to the first embodiment. Specifically, FIG. 5 is an example of the configuration of the inverter circuit suitable for a direct-current overhead wire of 1500 volts. In the example shown in FIG. 5, the positive side arms (UPI, VPI, and WPI) and the negative side arms (UNI, VNI, and WNI) shown in FIG. 1 are composed of six power semiconductor modules of the same type as the power semiconductor module 60A shown in FIG. 2. In each of 2-in-1 modules 60A1 to 60A6 composing each arm of the inverter circuit, a withstand voltage of a pair of elements is 1.7 kilovolts, for example, so that a withstand voltage of each of the 2-in-1 modules 60A1 to 60A6 connected in series is 1.7 kV×2=3.4 kV. Therefore, by using these 2-in-1 modules having the withstand voltage of 3.4 kilovolts as respective switching elements of the arms, it is possible to compose an inverter circuit that can be applied to a railway vehicle for the direct-current overhead wire of 1500 volts.

Figure 6:
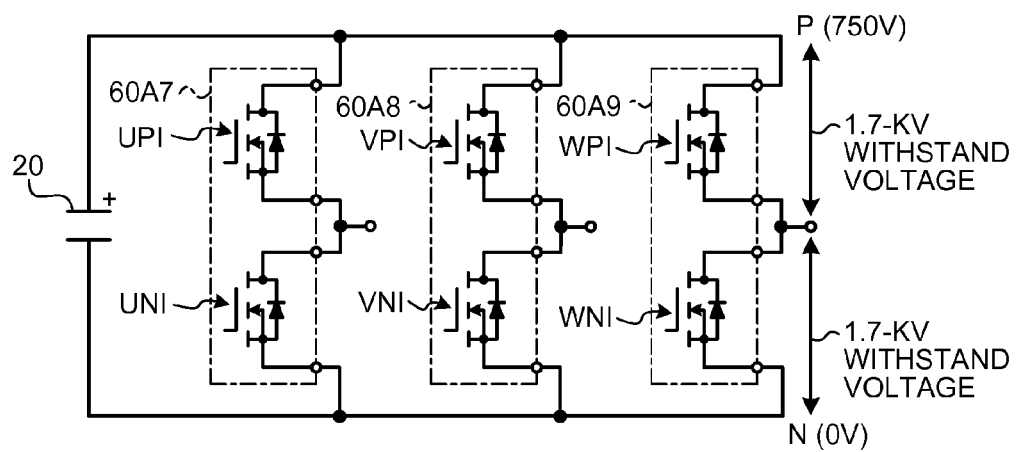
FIG. 6 is another example of the configuration of the inverter circuit composed of the power semiconductor module according to the first embodiment, which is different from that shown in FIG. 5.

FIG. 6 is another example of the configuration of the inverter circuit composed of the power semiconductor module according to the first embodiment. Specifically, FIG. 6 is an example of the configuration of the inverter circuit suitable for a direct-current overhead wire of 750 volts. In the example shown in FIG. 6, the legs shown in FIG. 1 (a U-phase (UPI and UNI), a V-phase (VPI and VNI), and a W-phase (WPI and WNI)) are composed of three power semiconductor modules of the same type as the power semiconductor module 60A shown in FIG. 2. In each of 2-in-1 modules 60A7 to 60A9 composing each leg of the inverter circuit, a withstand voltage of a pair of elements is 1.7 kilovolts, for example, so that by using a pair of elements in the 2-in-1 modules 60A7 to 60A9 as a switching element of each arm, it is possible to compose an inverter circuit that can be applied to a railway vehicle for the direct-current overhead wire of 750 volts.

Figure 7:
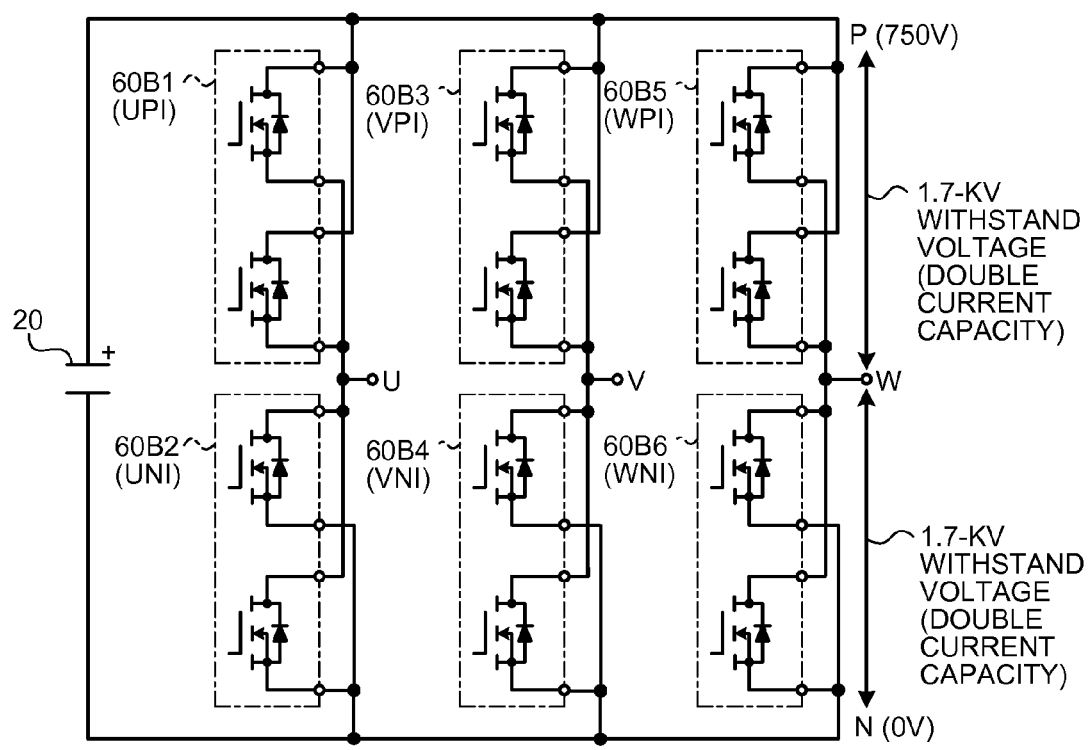
FIG. 7 is another example of the configuration of the inverter circuit composed of the power semiconductor module according to the first embodiment, which is different from those shown in FIGS. 5 and 6.

FIG. 7 is another example of the configuration of the inverter circuit composed of the power semiconductor module according to the first embodiment, which is different from those shown in FIGS. 5 and 6. Although the example shown in FIG. 7 is a configuration example of the inverter circuit suitable for the direct-current overhead wire of 750 volts in the same manner as that shown in FIG. 6, a current capacity of the power semiconductor module composing each arm is doubled. That is, the inverter circuit shown in FIG. 7 and the inverter circuit shown in FIG. 5 have substantially the same rated capacity.

In the example shown in FIG. 7, the positive side arms (UPI, VPI, and WPI) and the negative side arms (UNI, VNI, and WNI) are composed of six power semiconductor modules of the same type as the power semiconductor module 60B shown in FIG. 4. In each of 2-in-1 modules 60B1 to 60B6 composing each arm of the inverter circuit, the double current capacity is obtained by connecting two pairs of element in each 2-in-1 module in parallel. Because a withstand voltage of each of the pairs of elements connected in parallel is 1.7 kilovolts, it is possible to compose an inverter circuit that can be applied to a railway vehicle for the direct-current overhead wire of 750 volts by using the 2-in-1 modules having the withstand voltage of 1.7 kilovolts connected in parallel as respective switching elements of the arms.

Although application examples to the direct-current overhead wire are shown in the examples of FIGS. 5 to 7, it is needless to mention that the similar application can be made for an alternate-current overhead wire.

Advantages and effects of manufacturing the 2-in-1 modules shown in FIGS. 2 and 4 are explained next.

As described above, driving the IGBts connected in series causes a problem of equalizing the element voltages, while the IGBT can perform a high speed operation and an IGBT having a high withstand voltage and a large current capacity can be obtained relatively easily. For this reason, in the power semiconductor module in which the IGBT is incorporated, various types of modules having different withstand voltages are often developed, and in the power semiconductor module of the high withstand-voltage capability in which the IGBT is incorporated, a wide variety of kinds are necessary and each kind is manufactured in small quantities, and thus failing to obtain a mass production effect, making it difficult to reduce the cost.

In practice, in an application of the railway vehicle, for example, a power semiconductor module having of about 3.3 kilovolts is necessary for an overhead wire voltage of 1500 volts, and a power semiconductor module of about 6.5 kilovolts is necessary for, for example, an overhead wire voltage of 3000 volts abroad. However, such power semiconductor modules of the high withstand-voltage capability cannot be mass produced at the moment.

On the other hand, as shown in FIG. 1, as the configuration of the inverter circuit can be obtained by connecting the pairs of element in series in which the MOSFET and the FWD are connected in inverse parallel, such power semiconductor modules that can be applied to pairs of elements having various withstand voltages are expected to bring about a mass production effect. Furthermore, in the electric-power conversion apparatus, as shown in FIG. 1, a converter circuit having the same leg configuration as the inverter circuit is often included, so that there is an advantage that the similar application can be made for the converter circuit. Further, although an electric-power conversion apparatus for a railway vehicle is shown in FIG. 1, as an inverter circuit and a converter circuit having the same configuration are also used in an industrial machine, an electric vehicle, a hybrid vehicle, a power conditioner, and the like, there is an advantage that the present invention can be applied to these large number of applications.

For this reason, if the power semiconductor module (the 2-in-1 module) having general versatility such as those shown in FIGS. 2 and 4 is configured as the minimum unit, it is possible to obtain a power semiconductor module that can be applied to various applications and a high cost performance with a mass production effect can be expected therefrom.

Although the examples of the applications of the 2-in-1 module are shown in FIGS. 5 to 7, by combining a connection mode of each module (series connection and parallel connection) and a connection mode between the modules (series connection and parallel connection), there is an advantage that an application can be made for various electric-power conversion apparatus in response to a capability of the withstand voltage and the current capacity. Furthermore, as long as it is used as each arm element of the inverter circuit or the converter circuit, even when the power semiconductor module is composed of the 2-in-1 module, each pair of elements is not unused. Further, by composing the power semiconductor module of the 2-in-1 module, connection (wiring) of the pair of elements can be made easily, so that there is an effect that simplification of design or manufacturing can be achieved. In this respect, composing the power semiconductor module of the 2-in-1 module has a great significance.

As described above, with the power semiconductor module according to the first embodiment, as it is configured such that a first pair of elements that includes a Si-MOSFET and a Si-FWD connected in inverse parallel and operates as a positive side arm of an electric-power conversion apparatus and a second pair of elements that includes a Si-MOSFET and a Si-FWD connected in inverse parallel and operates as a negative side arm of the electric-power conversion apparatus are included, the first and second pairs of elements are accommodated in one module to compose a 2-in-1 module, and an external electrode terminal that enables series connection of the first and second pairs of elements is included, it is possible to obtain a power semiconductor module of a high withstand-voltage capability having general versatility while a mass production effect can be expected therefrom.

Furthermore, with the power semiconductor module according to the first embodiment, as it is configured such that a first pair of elements that includes a Si-MOSFET and a Si-FWD connected in inverse parallel and operates as either one of a positive side arm and a negative side arm of an electric-power conversion apparatus and a second pair of elements that includes a Si-MOSFET and a Si-FWD connected in inverse parallel and performs an arm operation of the same polarity as the first pair of elements are included, the first and second pairs of elements are accommodated in one module to compose a 2-in-1 module, and an external electrode terminal that enables series connection of the first and second pairs of elements and series connection with another power semiconductor module including the first and second pairs of elements is included, it is possible to obtain a power semiconductor module of a high withstand-voltage capability having general versatility while a mass production effect can be expected therefrom.

Further, with the power semiconductor module according to the first embodiment, as it is configured such that a first pair of elements that includes a Si-MOSFET and a Si-FWD connected in inverse parallel and operates as either one of a positive side arm and a negative side arm of an electric-power conversion apparatus and a second pair of elements that includes a Si-MOSFET and a Si-FWD connected in inverse parallel and performs an arm operation of the same polarity as the first pair of elements are included, the first and second pairs of elements are accommodated in one module to compose a 2-in-1 module, and an external electrode terminal that enables parallel connection of the first and second pairs of elements and series connection with another power semiconductor module including the first and second pairs of elements is included, it is possible to obtain a power semiconductor module of a high withstand-voltage capability having general versatility while a mass production effect can be expected therefrom.

Second Embodiment

Figure 8:
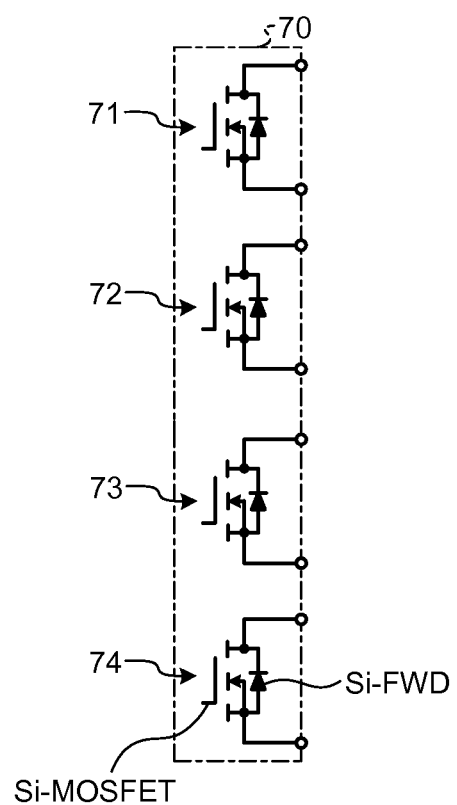
FIG. 8 is a schematic diagram of a circuit configuration of a power semiconductor module according to a second embodiment of the present invention.

FIG. 8 is a schematic diagram of a circuit configuration of a power semiconductor module according to a second embodiment of the present invention. As shown in FIG. 8, a power semiconductor module 70 according to the second embodiment includes four pairs of elements including a first pair of elements 71, a second pair of elements 72, a third pair of elements 73, and a fourth pair of elements 74 accommodated in a package. In each of the first pair of elements 71, the second pair of elements 72, the third pair of elements 73, and the fourth pair of elements 74, for example, a Si-MOSFET and a Si-FWD are connected in inverse parallel. In this manner, the power semiconductor module 70 according to the second embodiment is a so-called "4-in-1 module" in which four pairs of elements are accommodated in one module.

Figure 9:
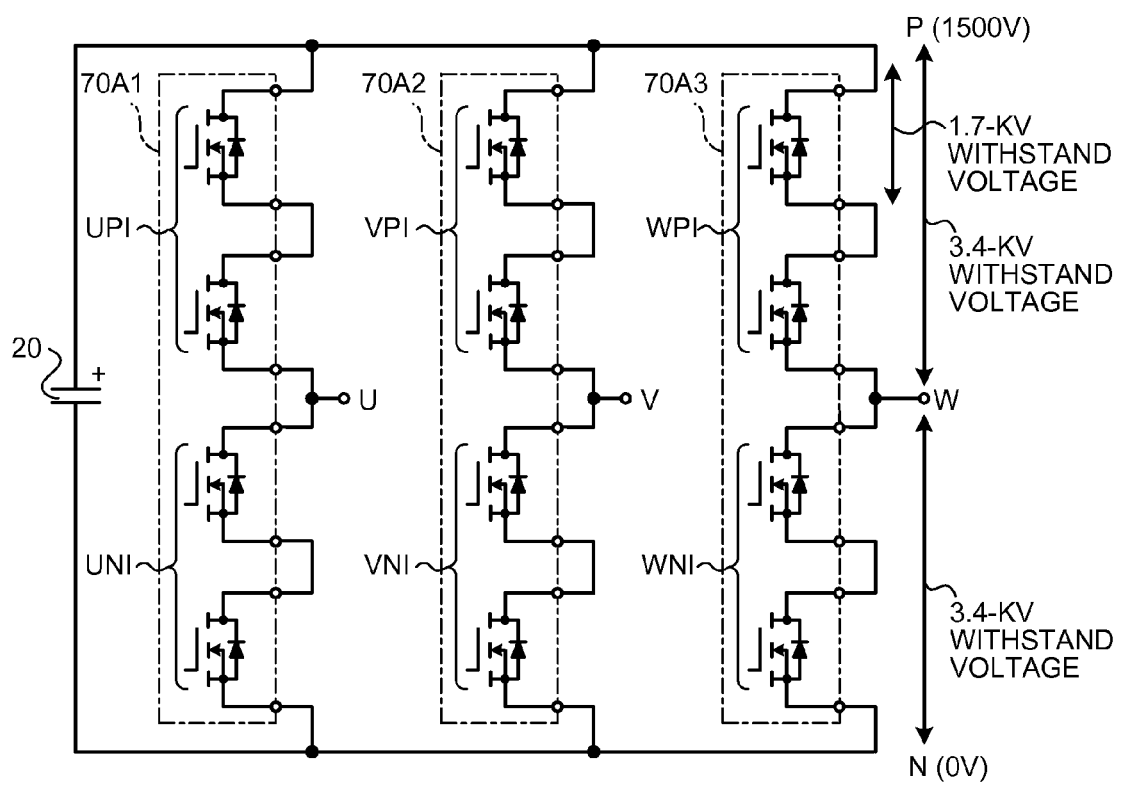
FIG. 9 is an example of a configuration of an inverter circuit composed of a power semiconductor module (a 4-in-1 module) according to the second embodiment.

FIG. 9 is an example of a configuration of an inverter circuit composed of the power semiconductor module (the 4-in-1 module) according to the second embodiment. Specifically, FIG. 9 is an example of the configuration of the inverter circuit suitable for a direct-current overhead wire of 1500 volts. In the example shown in FIG. 9, the legs (a U-phase (UPI and UNI), a V-phase (VPI and VNI), and a W-phase (WPI and WNI)) are composed of three power semiconductor modules of the same type as the power semiconductor module 70 shown in FIG. 8. In each of 4-in-1 modules 70A1 to 70A3 composing each leg of the inverter circuit, a withstand voltage of a pair of elements is 1.7 kilovolts, for example, so that by using the two pairs of elements of the 4-in-1 modules 70A1 to 70A3 as a switching element of each arm (that is, by using the two pairs of elements having a withstand voltage of 1.7 kV×2=3.4 kV as a switching element of each arm (the positive side arm and the negative side arm), is possible to compose an inverter circuit that can be applied to a railway vehicle for the direct-current overhead wire of 1500 volts.

Figure 10:
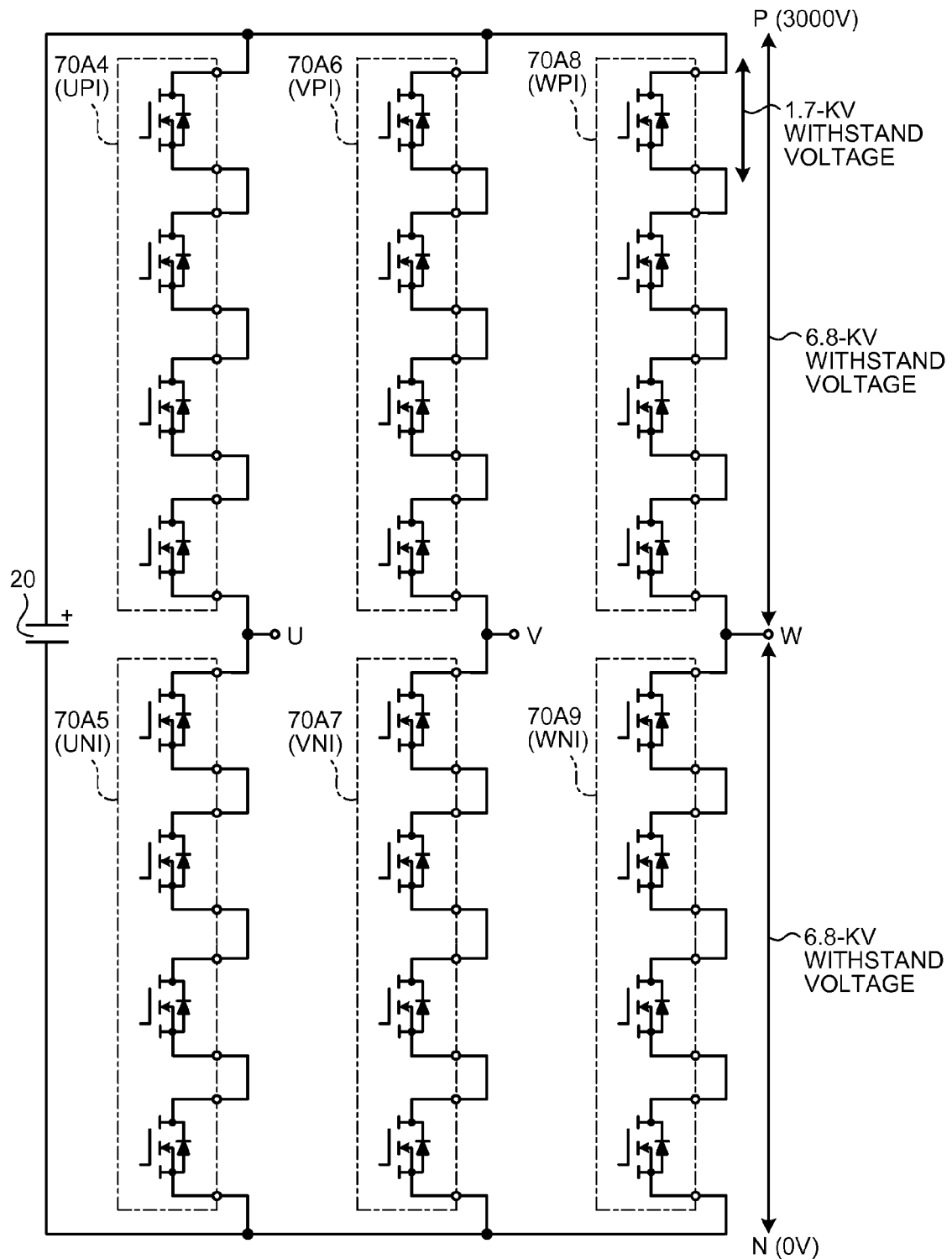
FIG. 10 is another example of the configuration of the inverter circuit composed of the power semiconductor module (the 4-in-1 module) according to the second embodiment, which is different from that shown in FIG. 9.

FIG. 10 is another example of the configuration of the inverter circuit composed of the power semiconductor module (the 4-in-1 module) according to the second embodiment. Specifically, FIG. 10 is an example of the configuration of the inverter circuit suitable for a direct-current overhead wire of 3000 volts. In the example shown in FIG. 10, the positive side arms (UPI, VPI, and WPI) and the negative side arms (UNI, VNI, and WNI) shown in FIG. 1 are composed of six power semiconductor modules (4-in-1 modules) 70A4 to 70A9 connected in series. In each of the 4-in-1 modules 70A4 to 70A9 composing each arm of the inverter circuit, a withstand voltage of a pair of elements is 1.7 kilovolts, for example, a withstand voltage of each of the 4-in-1 modules 70A4 to 70A9 connected in series is 1.7 kV×4=6.8 kV. Therefore, by using these 4-in-1 modules having the withstand voltage of 6.8 kilovolts as a switching element of each arm, it is possible to compose an inverter circuit that can be applied to a railway vehicle for the direct-current overhead wire of 3000 volts.

Figure 11:
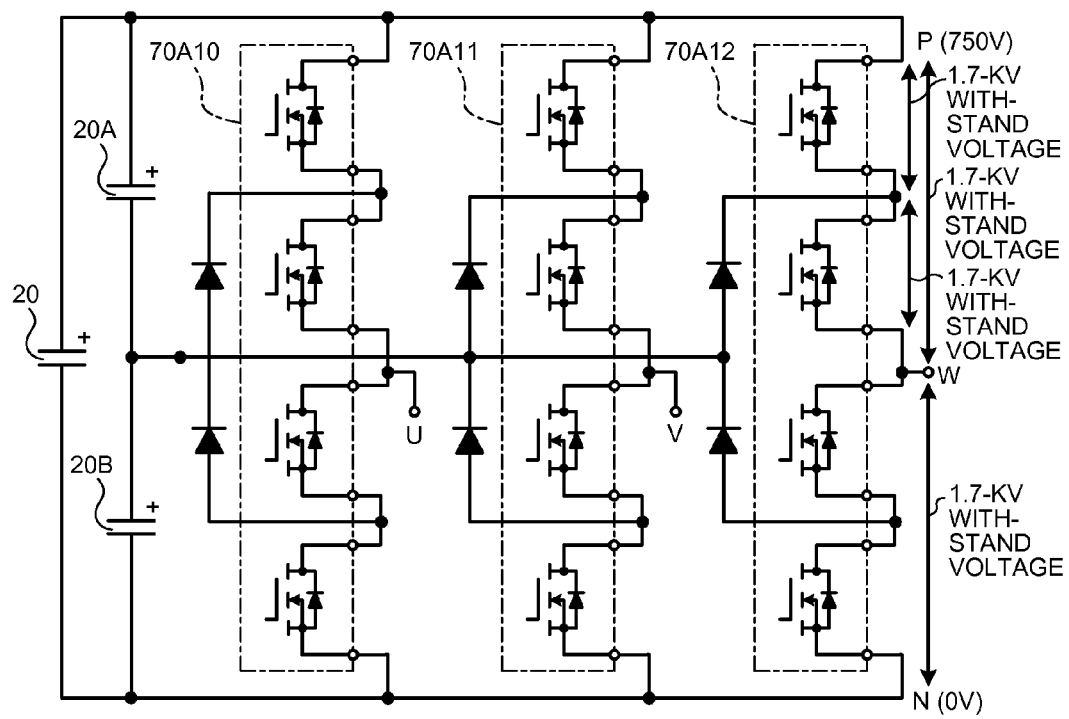
FIG. 11 is an example of a configuration of a three-level inverter circuit composed of the power semiconductor module (the 4-in-1 module) according to the second embodiment.

FIG. 11 is an example of a configuration of a three-level inverter circuit composed of the power semiconductor module (the 4-in-1 module) according to the second embodiment. Specifically, FIG. 11 is an example of the configuration of the three-level inverter circuit suitable for a direct-current overhead wire of 750 volts. In the example shown in FIG. 11, as a switching element composing each leg of the three-level inverter circuit (a switching element of each of the positive side arm and the negative side arm), it is configured by using three 4-in-1 modules 70A10 to 70A12. In the configuration shown in FIG. 11, among the four pairs of elements composing the 4-in-1 module 70A10, two upper side pairs of elements are used as switching elements of the positive side arm and two lower side pairs of elements are used as switching elements of the negative side arm. In the case of the three-level inverter circuit, as the switching elements composing each arm operate independently, a withstand voltage of an individual switching element composing each arm becomes a withstand voltage of each arm. Therefore, if the withstand voltage of each pair of elements is 1.7 kilovolts, the three-level inverter circuit configured as that shown in FIG. 11 becomes an inverter circuit that can be applied to a railway vehicle for the direct-current overhead wire of 750 volts.

Figure 12:
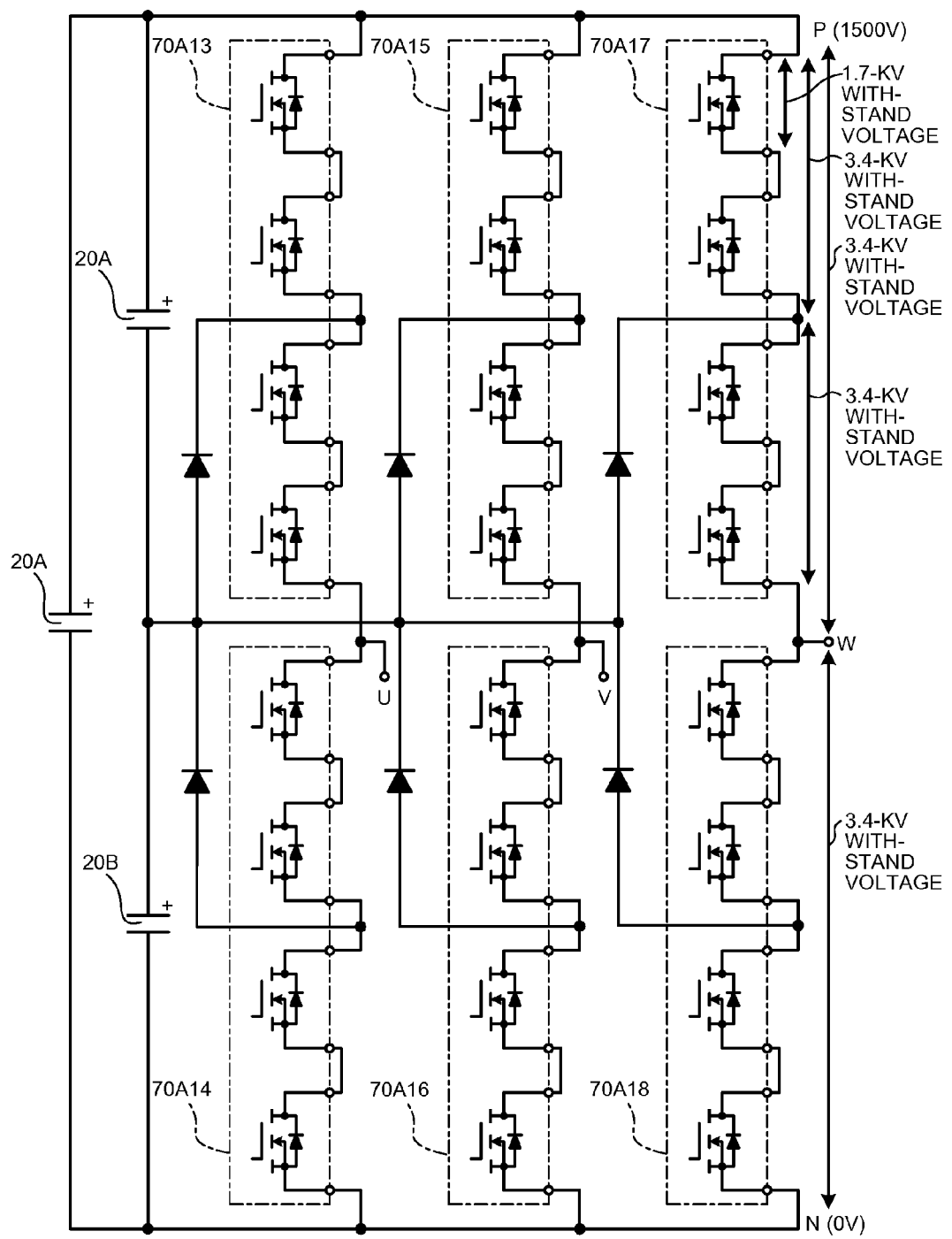
FIG. 12 is another example of the configuration of the three-level inverter circuit composed of the power semiconductor module (the 4-in-1 module) according to the second embodiment, which is different from that shown in FIG. 11.

FIG. 12 is another example of the configuration of the three-level inverter circuit composed of the power semiconductor module (the 4-in-1 module) according to the second embodiment. Specifically, FIG. 12 is an example of the configuration of the three-level inverter circuit suitable for a direct-current overhead wire of 1500 volts. In the example shown in FIG. 12, it is configured by using six 4-in-1 modules 70A13 to 70A18 connected in series. In the configuration shown in FIG. 12, four pairs of elements composing the 4-in-1 module 70A13 are used as a switching element of the positive side arm, four pairs of elements composing the 4-in-1 module 70A14 are used as a switching element of the negative side arm, and these 4-in-1 modules 70A13 and 70A14 are connected in series to be used as one leg. In the 4-in-1 module 70A13 used as the positive side arm, as two upper side pairs of elements and two lower side pairs of elements perform the same switching operation in an integrated manner, respectively, a withstand voltage of the two pairs of elements connected in series become a withstand voltage of each arm. Therefore, if the withstand voltage of each pair of elements is 1.7 kilovolts, the three-level inverter circuit configured as that shown in FIG. 12 becomes an inverter circuit that can be applied to a railway vehicle for the direct-current overhead wire of 1500 volts.

Although the examples of the applications of the 4-in-1 module are shown in FIGS. 9 to 12, by combining a connection mode of each module (series connection and parallel connection) and a connection mode between the modules (series connection and parallel connection), there is an advantage that an application can be made for various electric-power conversion apparatus in response to a capability of the withstand voltage and the current capacity. Furthermore, when using it as each arm element of an inverter circuit including a three-level inverter circuit or a converter circuit including a three-level converter circuit, even when the power semiconductor module is composed of the 4-in-1 module, each pair of elements is not unused. Meanwhile, by composing the power semiconductor module of the 4-in-1 module, connection (wiring) of the pair of elements can be made easily, so that there is an effect that simplification of design or manufacturing can be achieved. In this respect, composing the power semiconductor module of the 4-in-1 module has a great significance.

As described above, with the power semiconductor module according to the second embodiment, as it is configured such that a first pair of elements that includes a Si-MOSFET and a Si-FWD connected in inverse parallel and operates as a positive side arm of an electric-power conversion apparatus, a second pair of elements that includes a Si-MOSFET and a Si-FWD connected in inverse parallel and performs an arm operation of the same polarity as the first pair of elements, a third pair of elements that includes a Si-MOSFET and a Si-FWD connected in inverse parallel and operates as a negative side arm of the electric-power conversion apparatus, and a fourth pair of elements that includes a Si-MOSFET and a Si-FWD connected in inverse parallel and performs an arm operation of the same polarity as the third pair of elements are included, the first to fourth pairs of elements are accommodated in one module to compose a 4-in-1 module, and external electrode terminals that enable series connection of the first and second pairs of elements and series connection of the second and third pairs of elements, and series connection of the third and fourth pairs of elements are included, it is possible to obtain a power semiconductor module of a high withstand-voltage capability having general versatility while a mass production effect can be expected therefrom.

Furthermore, with the power semiconductor module according to the second embodiment, as it is configured such that a first pair of elements that includes a Si-MOSFET and a Si-FWD connected in inverse parallel and operates as either one of a positive side arm or a negative side arm of an electric-power conversion apparatus, and second to fourth pairs of elements each including a Si-MOSFET and a Si-FWD connected in inverse parallel and performing an arm operation of the same polarity as the first pair of elements are included, the first to fourth pairs of elements are accommodated in one module to compose a 4-in-1 module, and external electrode terminals that enable series connection of the first and second pairs of elements and series connection of the second and third pairs of elements, series connection of the third and fourth pairs of elements, and series connection with another power semiconductor module including the first to fourth pairs of elements are included, it is possible to obtain a power semiconductor module of a high withstand-voltage capability having general versatility while a mass production effect can be expected therefrom.

Third Embodiment

Figure 13:
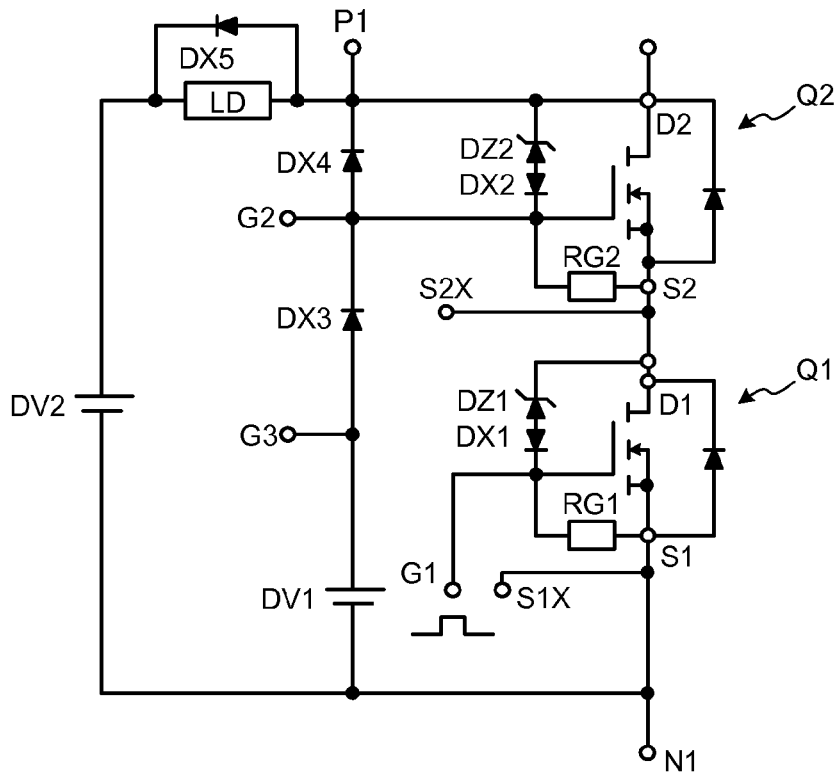
FIG. 13 is a circuit diagram of an example of a configuration of a driving circuit including the power semiconductor module according to the first and second embodiment.
Figure 14:
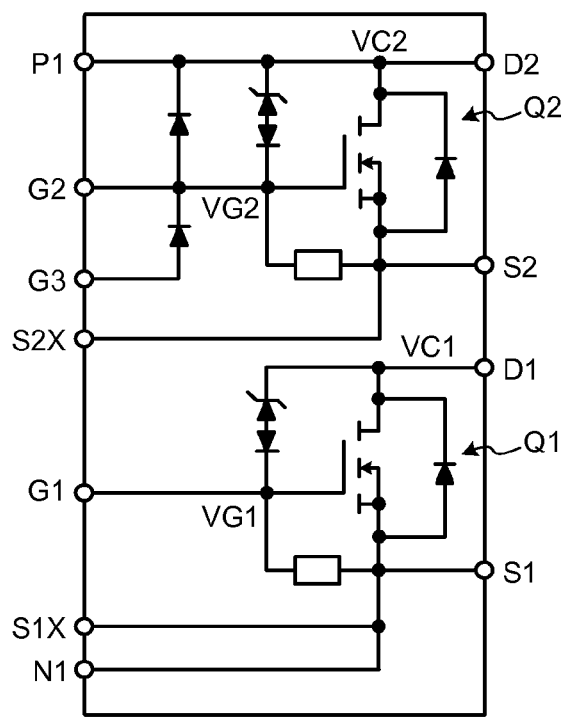
FIG. 14 is an example of a configuration when the driving circuit shown in FIG. 13 is configured as a driving module.

FIG. 13 is a circuit diagram of an example of a configuration of a driving circuit including the power semiconductor module according to the first and second embodiment, and FIG. 14 is an example of a configuration when the driving circuit shown in FIG. 13 is configured as a driving module. In the driving circuit according to a third embodiment of the present invention, pairs of elements Q1 and Q2, in each of which, for example, a Si-MOSFET and a Si-FWD are connected in inverse parallel, are connected in series, and various circuit elements for driving the pairs of elements Q1 and Q2 connected in series are provided. Although the configuration in which the pairs of elements Q1 and Q2 are connected in series is shown in FIG. 13, the number of pairs of elements connected in series is not limited two, but three or more pairs of elements can be connected in series, being configured to include the same circuit elements in a longitudinal direction.

The circuit configuration of FIG. 13 is explained next. In FIG. 13, a resistor RG1 is inserted between a source terminal S1 and a gate terminal G1 of the pair of elements Q1, and a resistor RG2 is inserted between a source terminal S2 and a gate terminal G2 of the pair of elements Q2. Furthermore, a diode DX1 and a zener diode DZ1 connected in series are inserted between a drain terminal D1 and the gate terminal G1 of the pair of elements Q1, and a diode DX2 and a zener diode DZ2 connected in series are inserted between a drain terminal D2 and the gate terminal G2 of the pair of elements Q2. The zener diodes DZ1 and DZ2 are overvoltage clamping elements for clamping gate-drain voltages of the pairs of elements Q1 and Q2 to be equal to or lower than withstand voltages of the pairs of elements Q1 and Q2, respectively, and the diodes DX1 and DX2 are unidirectional conducting elements forward connected in a direction from the drain to the gate, that is, reverse-current preventing elements for preventing currents flowing from the gate to the drain.

The resistors RG1 and RG2 are bias resistors for applying bias voltages when turning on the pairs of elements Q1 and Q2, respectively, diodes DX3 and DX4 are voltage fixing elements for fixing a gate potential and a drain potential of a pair of elements respectively connected in series (in the example shown in FIG. 13, the pair of elements Q2) to a direct-current power-source potential, the diode DX3 is connected between terminals G2 and G3, and the diode DX4 is connected between terminals P1 and G2. The diode DX4 also functions as a discharge resistor inserted on a discharge path when discharging an electric charge charged between gate and source and between gate and drain when the pair of elements Q2 is turned off.

Although a gate power source DV1, a main-circuit power source DV2, a load LD connected to a positive terminal side of the main-circuit power source DV2, and a diode DX5 connected in parallel to the load LD are shown in the driving circuit shown in FIG. 13, these elements are not composition elements of the driving module. As shown in FIG. 14, the driving module is configured to include external connection terminals G1 to G3, D1, D2, S1, S2, S1X, S2X, P1, and N1.

Figure 15:
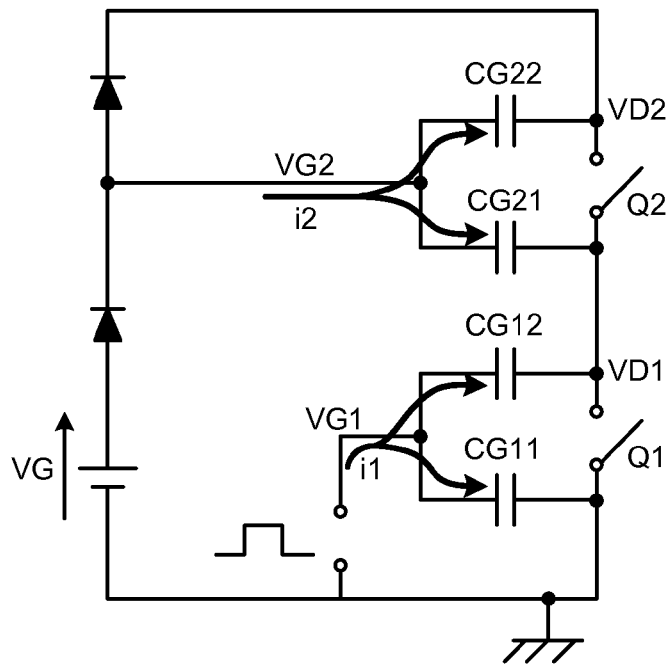
FIG. 15 is an equivalent circuit diagram of a driving module in which each pair of elements is replaced with a switch and capacitors, depicting a turn-on operation of the pairs of elements.
Figure 16:
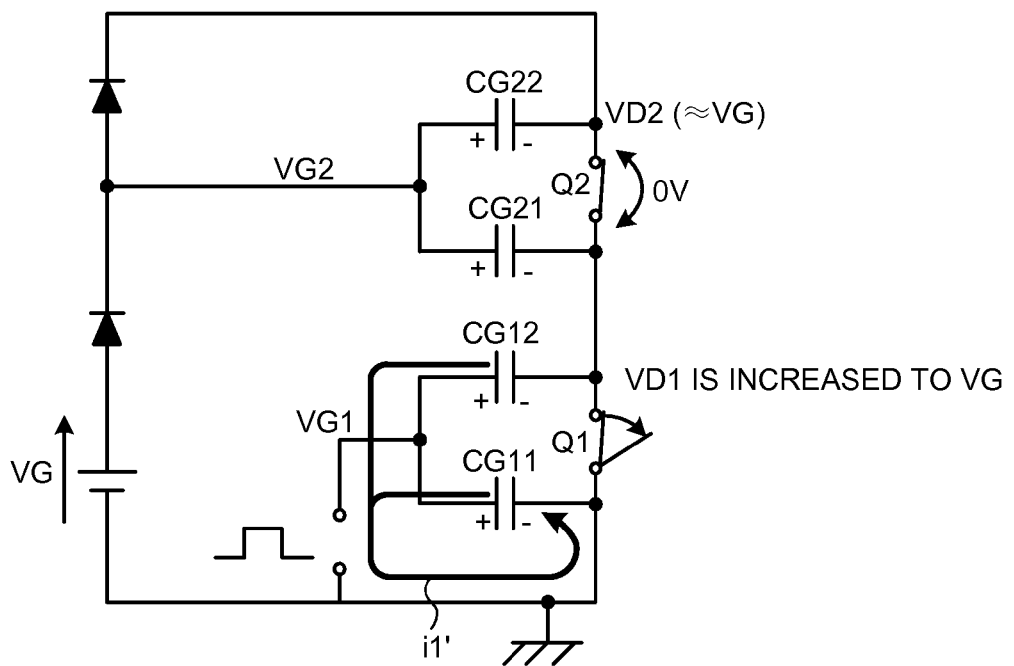
FIG. 16 is an explanatory diagram of a discharge operation of one pair of elements at a time of a turn-off operation.
Figure 17:
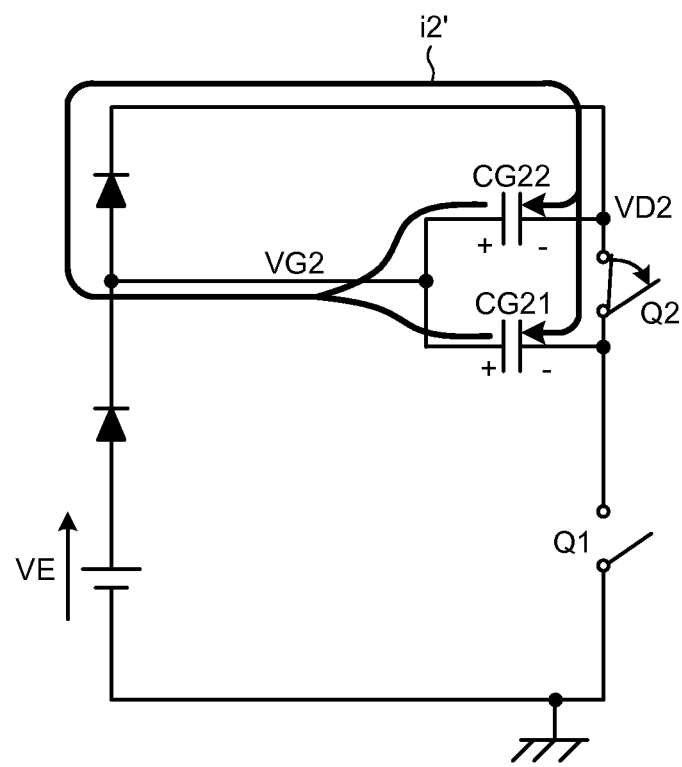
FIG. 17 is an explanatory diagram of a discharge operation of the other pair of elements at the time of the turn-off operation.

An operation of the driving module shown in FIG. 14 is explained next with reference to the drawings of FIGS. 15 to 17. FIG. 15 is an equivalent circuit diagram of a driving module in which each pair of elements is replaced with a switch and capacitors, depicting a turn-on operation of the pairs of elements Q1 and Q2. FIGS. 16 and 17 are explanatory diagrams of a turn-off operation of the pairs of elements Q1 and Q2, where FIG. 16 depicts a discharge operation of the pair of elements Q1, and FIG. 17 depicts a discharge operation of the pair of elements Q2.

The turn-on operation is explained first. In FIG. 15, when a gate voltage (a gate pulse) is applied to the gate terminal of the pair of elements Q1, a charge current i1 flows to a gate-source capacitance CG11. Subsequently, when the gate voltage VG1 exceeds a gate threshold voltage, the pair of elements Q1 is turned on. In this process, a drain voltage VD1 is decreased, and when the drain voltage VD1 is decreased below the gate voltage VG1, the charge current i1 flowing to the gate-source capacitance CG11 changes its flowing direction to a gate-drain capacitance CG12. Furthermore, with the decrease of the drain voltage VD1, a charge current i2 flows to a gate-source capacitance CG21, and a gate voltage VG2 is increased. Thereafter, when the gate voltage VG2 exceeds the gate threshold voltage, the pair of elements Q2 is turned on. After that, the charge current i2 flowing to the gate-source capacitance CG21 changes its flowing direction to a gate-drain capacitance CG22, and an electric charge is charged also in the gate-source capacitance CG21.

The driving module according to the third embodiment performs an operation in the above manner to sequentially turn on the pairs of elements Q1 and Q2. The same goes for a case where three or more pairs of elements are connected, in such a manner that each pair of elements is sequentially turned on from a pair of elements that is first driven (the pair of elements Q1) and finally all the pairs of the elements are turned on.

A turn-off operation is explained next. In FIG. 16, when the gate voltage applied to the gate terminal of the pair of elements Q1 is turned off, a discharge current i1' starts to flow. By this discharge current i1', the electric charges charged in the gate-source capacitance CG11 and the gate-drain capacitance CG12 are discharged via a gate circuit (not shown) connected to the gate terminal and finally extinguished. In this discharge process, the pair of elements Q1 is turned off. When the pair of elements Q1 is in an on state, the drain voltage VD1 of the pair of elements Q1 is the same as a GND level; however, when the pair of elements Q1 is turned off, the drain voltage VD1 is increased to a drain voltage VD2 of the pair of elements Q2 ($\infty$VG) (because the pair of elements Q2 is in an on state).

When the drain voltage VD2 of the pair of elements Q2 is increased to VG, as the gate voltage VG2 of the pair of elements Q2 is also increased with the voltage increase, a discharge current i2' flows through the diode DX4. By this discharge current i2', the electric charges charged in the gate-source capacitance CG11 and the gate-drain capacitance CG12 are discharged and finally extinguished. In these discharge processes, the pair of elements Q2 is turned off.

The driving module according to the third embodiment performs an operation in the above manner to sequentially turn off the pairs of elements Q1 and Q2. The same goes for a case where three or more pairs of elements are connected, in such a manner that each pair of elements is sequentially turned off from a pair of elements that is first driven (the pair of elements Q1) and finally all the pairs of the elements are turned off.

In the discharge operation explained above, as the electric charges charged in the gate-source capacitance CG11 and the gate-drain capacitance CG12 of the pair of elements Q1 are discharged through the gate circuit having a small internal resistance, a discharge time constant is small and the discharge operation is fast. Furthermore, as the electric charges charged in the gate-source capacitance CG21 and the gate-drain capacitance CG22 of the pair of elements Q2 are discharged through the diode DX4 having a small forward resistance, a discharge time constant is small and the discharge operation is fast. Particularly, if the diode DX4 is not provided, as a discharge path of the gate-source capacitance CG21 and the gate-drain capacitance CG22 becomes a discharge path through the resistor RG2 that is a bias resistor, the discharge speed is slowed, and losses at the pair of elements Q2 and the zener diode DZ2 are increased.

On the other hand, in the driving module according to this embodiment, as the diode DX4 is connected between the gate and the drain of the pair of elements Q2, and the discharge path is formed through this diode DX4, a fast discharge speed can be obtained (the discharged time is shortened), and the losses at the pair of elements and the zener diode DZ2 can be decreased. Furthermore, the discharge speed of the electric charges charged in the gate-source capacitance CG21 and the gate-drain capacitance CG22 of the pair of elements Q2 is fast (the discharge time is short), there is also an effect of shortening the turn-off time of the whole module connected in series can be obtained.

Figure 18:
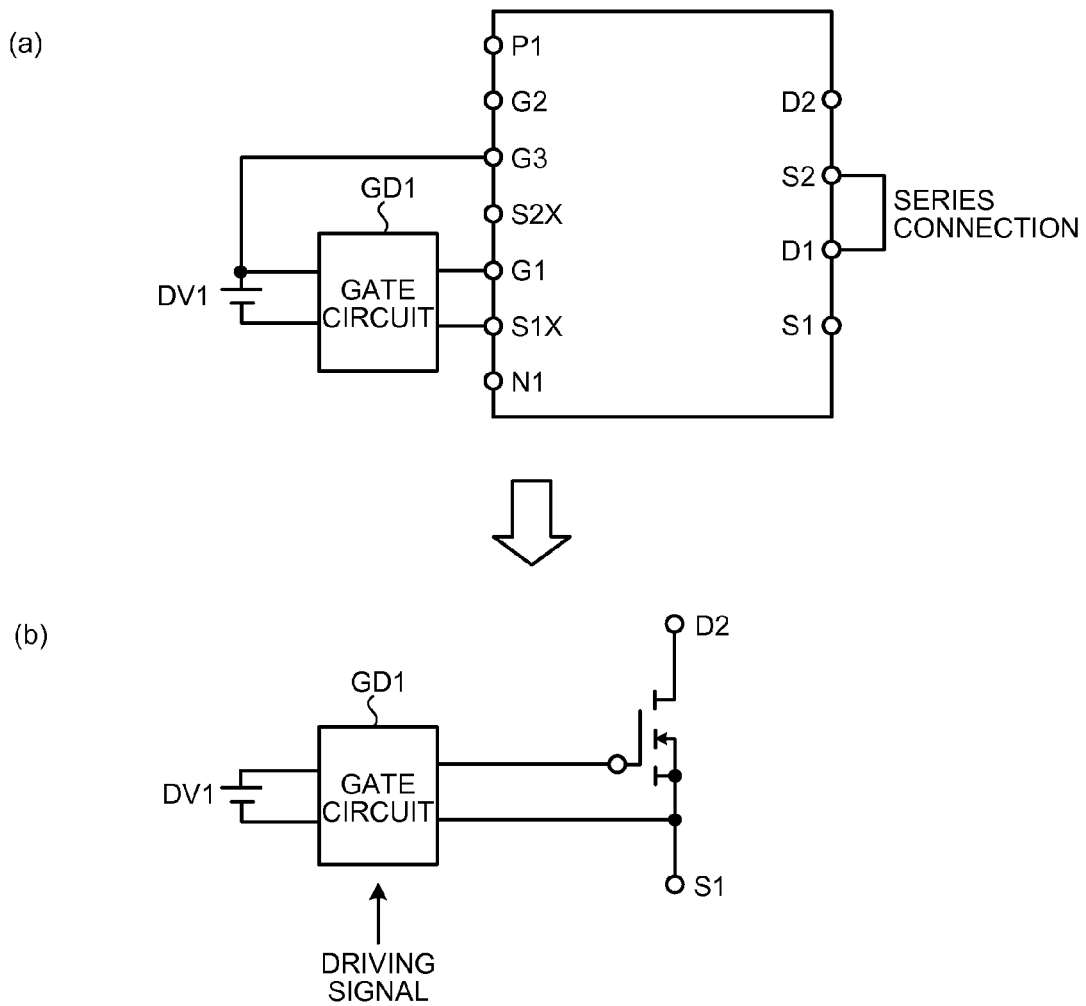
FIG. 18 shows an example of connection when using two switching elements (pairs of elements) mounted on the driving module shown in FIG. 14 by connecting them in series.
Figure 19:
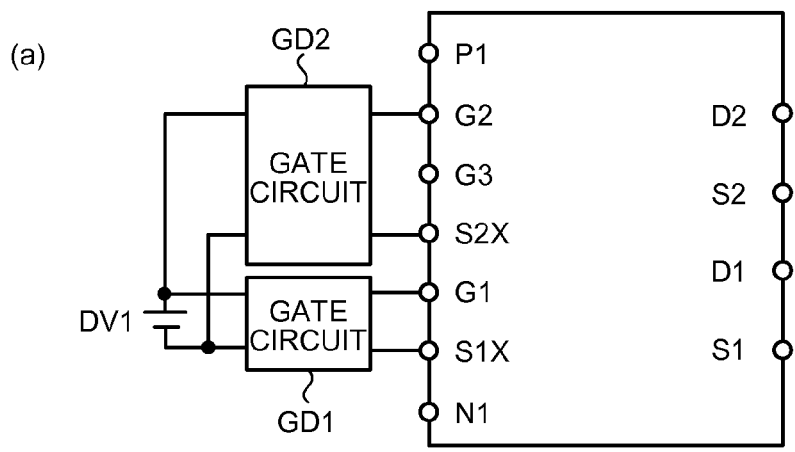
FIG. 19 shows an example of connection when using two MOS semiconductor elements (pairs of elements) individually without connecting them in series.
Figure 19:
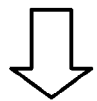
Figure 19:
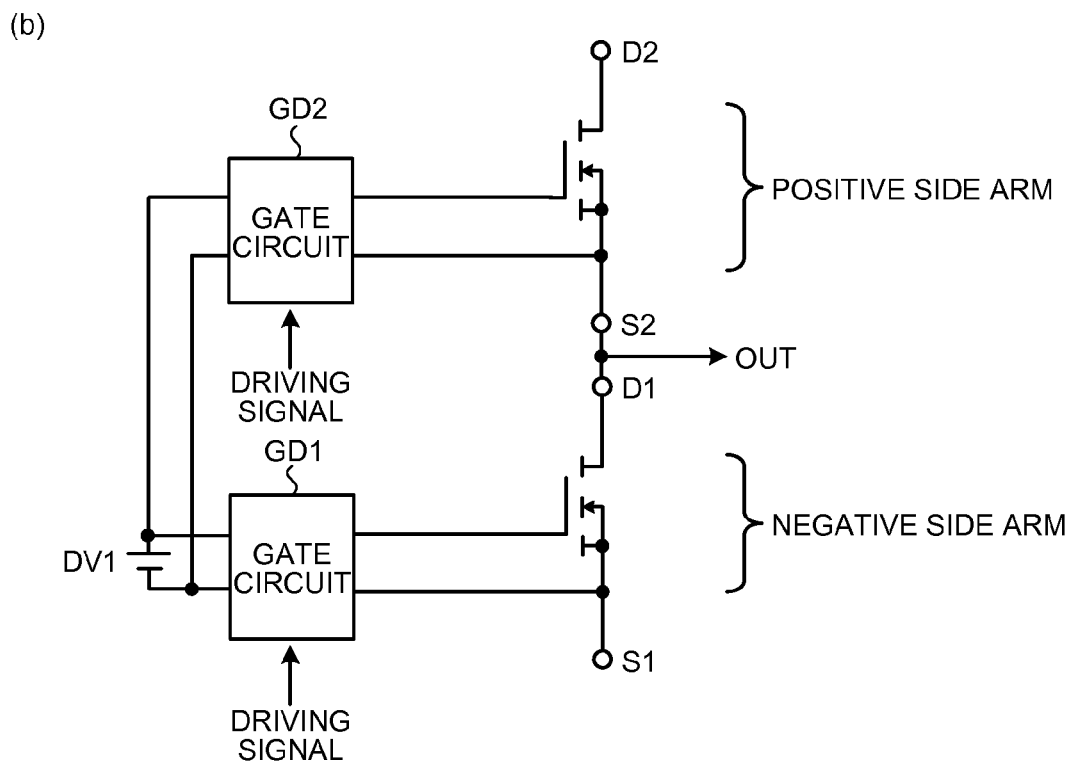

FIG. 18 shows an example of connection when using two switching elements (pairs of elements) mounted on the driving module shown in FIG. 14 by connecting them in series, and FIG. 19 shows an example of connection when using two MOS semiconductor elements (pairs of elements) individually without connecting them in series.

When using the two switching elements (pairs of elements) mounted on the driving module shown in FIG. 14 by connecting them in series, as shown in FIG. 18(a), terminals S2 and D1 are first short-circuited. By short-circuiting the terminals S2 and D1, this driving module becomes a module in which the two switching elements (pairs of elements) are connected in series. Subsequently, a gate circuit GD1 is connected between terminals G1 and S1X, and a positive side terminal of a direct-current power source DV1 applied to the gate circuit GD1 is connected to a terminal G3. With this connection, an equivalent circuit of the driving module shown in FIG. 18(a) becomes that shown in FIG. 18(b), and it is possible to use a single unit of the driving module as one switching element.

Furthermore, when using the two MOS semiconductor elements (pairs of elements) mounted on the driving module shown in FIG. 14 individually without connecting them in series, as shown in FIG. 19(a), the gate circuit GD1 is first connected between the terminals G1 and S1X, and a gate circuit GD2 different from the gate circuit GD1 is connected between terminals G2 and S2X. The direct-current power source DV1 is further connected to both terminals of the gate circuits GD1 and GD2. With this connection, an equivalent circuit of the driving module shown in FIG. 19(a) becomes that shown in FIG. 19(b), and it is possible to use a single unit of the driving module as a switching element of a positive side arm composing one leg.

As described above, as it is configured such that a resistor is connected between the gate and the source of the Si-MOSFET composing the pairs of elements Q1 and Q2, a series circuit of the overvoltage clamping element (the zener diodes DZ1 and DZ2) and the unidirectional conducting element (the diodes DX1 and DX2) forward connected in the direction from the drain to the gate is connected between the gate and the drain of the Si-MOSFET, the voltage fixing element (the diode DX3) is connected to the gate of the pair of elements Q2, and the voltage fixing element (the diode DX4) is connected between the gate and the drain, it is possible to provide a power semiconductor module using the MOS switching element in a simple manner.

Although an example of using the Si-MOSFET as the switching element composing each pair of elements in the 2-in-1 module and using the Si-FWD as the FWD has been explained in the first to third embodiments described above, the present invention is not limited to the Si-MOSFET and the Si-FWD. Instead of the Si, it is possible to compose the present invention by using a silicon carbide (SiC)-based element that has been attracting attention in recent years.

In this case, as the SiC has a characteristic that it can be used at a high temperature, if a SIC-MOSFET is used as the switching element composing each pair of elements and a FWD that can be used at a high temperature, for example, a SiC-Schottky diode, it is possible to increase a tolerable operation temperature of a module using a SiC-MOSFET chip and a SiC-FWD chip to 150° C. or higher. Therefore, a chip occupation area in each pair of elements can be further reduced, thereby obtaining an effect that a module size can be further reduced.

In the case of using the SiC, as a chip thickness can be reduced, there is another advantage that a thermal resistance can be reduced. Furthermore, in the case of using the SiC as the FWD, as the turn-on voltage can be reduced, there is another advantage that a recovery loss can be greatly reduced. Therefore, even if the chip size is reduced, there is an effect that the loss can be reduced while suppressing an increase of the temperature.

Because a SiC-based power semiconductor module has a relatively short manufacturing history, a product having a high withstand voltage is considerably expensive. However, if a driving technique with respect to the MOS semiconductor elements connected in series as described above is employed, a plurality of MOS semiconductor elements of a low withstand-voltage capability can be used instead of a MOS semiconductor element of the high withstand-voltage capability, and therefore there is no need for developing a MOS semiconductor element of the high withstand-voltage capability. This leads to a great cost performance, which enables a low cost of the semiconductor power module and a low cost of the electric-power conversion apparatus.

The SiC is an example of a semiconductor referred to as "wide bandgap semiconductor", and other than the SiC, for example, a gallium nitride-based material or a diamond-based semiconductor also belongs to the wide bandgap semiconductor. Therefore, the configuration of using the wide bandgap semiconductor other than the SiC is also included in the scope of the present invention.

Furthermore, the configurations described in the first to third embodiments are only an example of the configuration of the present invention, and it is needless to mention that these configurations can be combined with other well-known techniques, and can be modified within the scope of the present invention, such as omitting a part thereof.

Further, in the above embodiments, the contents of the invention have been explained such that the present invention is targeted for a power semiconductor module that is assumed to be applied to the technical field of electric railway; however, the application field of the present invention is not limited thereto, and it is needless to mention that the present invention is applicable to various industrial application fields.

INDUSTRIAL APPLICABILITY

As described above, the present invention is useful as a power semiconductor module of a high withstand-voltage capability having general versatility and capable of achieving a mass production effect.

REFERENCE SIGNS LIST

1 OVERHEAD WIRE
2 POWER COLLECTING DEVICE
3 WHEEL
4 RAIL
6 TRANSFORMER
10 CONVERTER
20 CAPACITOR
30 INVERTER
50 ELECTRIC-POWER CONVERSION APPARATUS
60A, 60B, 70 POWER SEMICONDUCTOR MODULE
60A1 to 60A9, 60B1 to 60B6 2-IN-1 MODULE
62, 64, 71 to 74, Q1, Q2 PAIR OF ELEMENTS
70A1 to 70A18 4-IN-1 MODULE
100 RAILWAY VEHICLE
UNC, VNC, UNI, VNI, WNI, UPC, VPC, UPI, VPI, WPI SWITCHING ELEMENT
DV1 GATE POWER SOURCE
DV2 MAIN-CIRCUIT POWER SOURCE
DX1 to DX4 DIODE
DZ1, DZ2 ZENER DIODE
RG1, RG2 RESISTOR
GD1, GD2 GATE CIRCUIT

The invention claimed is:

1. A power semiconductor module comprising:
a first pair of elements that includes a diode element and a MOS switching element connected in inverse parallel; and
a second pair of elements that includes a diode element and a MOS switching element connected in inverse parallel, wherein
the first and second pairs of elements are accommodated in one module to compose a 2-in-1 module, and
the power semiconductor module further comprises
external electrode terminals that enable connection of the first and second pairs of elements;
a resistor connected between a gate terminal and a source terminal of a MOS switching element constituting each of the pair of elements;
a series circuit of an overvoltage clamping element that clamps a gate-drain voltage of the MOS switching element to be equal to or lower than a withstand voltage of the MOS switching element and a unidirectional conducting element forward connected in a direction from a drain terminal to the gate terminal being connected between the gate terminal and the drain terminal of the MOS switching elements;
a first voltage fixing element that fixes a gate potential of the MOS switching element of the second pair of elements to a potential of a direct-current power source of the MOS switching element being connected to a gate terminal of the MOS switching element of the second pair of elements; and
a second voltage fixing element that fixes a drain potential of the MOS switching element to the potential of the direct-current power source being connected between the gate terminal and a drain terminal of the MOS switching element of the second pair of elements.

2. The power semiconductor module according to claim 1, wherein at least one of the diode element and the MOS switching element is a wide bandgap semiconductor.

3. The power semiconductor module according to claim 2, wherein the diode element is a Schottky diode.

4. The power semiconductor module according to claim 2, wherein the wide bandgap semiconductor is one of a silicon carbide-based semiconductor, a gallium nitride-based semiconductor, and a diamond-based semiconductor.

* * * * *